US008816746B2

(12) United States Patent
Wen et al.

(10) Patent No.: US 8,816,746 B2
(45) Date of Patent: Aug. 26, 2014

(54) INTEGRATED CIRCUIT WITH MULTI-FUNCTIONAL PARAMETER SETTING AND MULTI-FUNCTIONAL PARAMETER SETTING METHOD THEREOF

(71) Applicant: uPI Semiconductor Corp., Hsinchu County (TW)

(72) Inventors: Wei-Jhih Wen, Hsinchu County (TW); Ting-Hung Wang, Hsinchu County (TW); Sheng-Hsuan Wang, Hsinchu County (TW); Wei-Ling Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 13/781,772

(22) Filed: Mar. 1, 2013

(65) Prior Publication Data

US 2014/0132324 A1 May 15, 2014

(30) Foreign Application Priority Data

Nov. 13, 2012 (TW) ............................ 101142250 A

(51) Int. Cl.
*H03L 5/00* (2006.01)

(52) U.S. Cl.
USPC ............................................ 327/306; 327/50

(58) Field of Classification Search
USPC ................................................... 327/50, 306
See application file for complete search history.

(56) References Cited

U.S. PATENT DOCUMENTS

| | | | | |
|---|---|---|---|---|
| 6,462,971 | B1 | 10/2002 | Balakrishnan et al. | |
| 7,098,632 | B2 | 8/2006 | Chen et al. | |
| 7,233,131 | B2 | 6/2007 | Lin et al. | |
| 7,253,997 | B2 | 8/2007 | Balakrishnan et al. | |
| 7,457,138 | B2 * | 11/2008 | Sheng et al. | 363/21.12 |
| 7,504,816 | B2 | 3/2009 | Laur et al. | |
| 7,928,787 | B2 | 4/2011 | Mehas et al. | |
| 7,986,137 | B2 | 7/2011 | Laur et al. | |
| 8,222,876 | B2 | 7/2012 | Wang | |
| 8,436,664 | B2 * | 5/2013 | Wang et al. | 327/142 |
| 2010/0066337 | A1 * | 3/2010 | Gong et al. | 323/285 |
| 2012/0120533 | A1 * | 5/2012 | Huang et al. | 361/56 |
| 2013/0083562 | A1 * | 4/2013 | Wu et al. | 363/16 |
| 2014/0016378 | A1 * | 1/2014 | Ke et al. | 363/21.18 |

* cited by examiner

*Primary Examiner* — William Hernandez
(74) *Attorney, Agent, or Firm* — Jianq Chyun IP Office

(57) ABSTRACT

An integrated circuit with multi-functional parameter setting and a multi-functional parameter setting method of the integrated circuit are provided. The multi-functional parameter setting method includes following steps: providing the integrated circuit which includes a switch unit and a multi-functional pin that is coupled to an external setting unit, sensing a programmable reference voltage of the external setting unit through one operation of the switch unit and executing a first function setting according to the programmable reference voltage, and sensing a programmable reference current of the external setting unit through another operation of the switch unit and executing a second function setting according to the programmable reference current.

12 Claims, 5 Drawing Sheets

INTEGRATED CIRCUIT WITH MULTI-FUNCTIONAL PARAMETER SETTING AND MULTI-FUNCTIONAL PARAMETER SETTING METHOD THEREOF

CROSS-REFERENCE TO RELATED APPLICATION

This application claims the priority benefit of Taiwan application serial no. 101142250, filed on Nov. 13, 2012. The entirety of the above-mentioned patent application is hereby incorporated by reference herein and made a part of this specification.

BACKGROUND OF THE INVENTION

1. Field of the Invention

The invention relates to a power management integrated circuit (IC), and more particularly to an IC with multi-functional parameter setting and a multi-functional parameter setting method of the IC.

2. Description of Related Art

In a typical computer system, a voltage identification definition (VID) provided by a central processing unit (CPU) varies according to its work mode so as to dynamically adjust its operational voltage (or core voltage) to save power consumption. When the computer system does not require significant power consumption on the considerable amount of computation, the CPU generates the VID according to its work mode and transmits the VID to a voltage regulator. The voltage regulator then reduces the operational voltage of the CPU according to the VID.

A conventional integrated circuit (IC) utilized for regulating a voltage may have additional functions. For instance, the conventional IC may perform a droop function to sense whether a droop current exists. If the IC capable of performing other functions regulates the voltage, other pins and a number of additional setting components are required by the IC to regulate the operational voltage of the CPU. This may lead to an overall increase in the area occupied by the IC and may raise the manufacturing costs of the IC.

With the progress of electronic technologies, the IC is able to perform a variety of functions. Nonetheless, the limited number of the pins in the IC may restrain the IC from executing the additional function settings.

SUMMARY OF THE INVENTION

An exemplary embodiment of the invention is directed to an integrated circuit (IC) with multi-functional parameter setting and a multi-functional parameter setting method of the IC for addressing the above described problem.

In an exemplary embodiment of the invention, an IC with multi-functional parameter setting is provided. The IC is coupled to an external setting unit. Besides, the IC includes a multi-functional pin, a first function adjustment circuit, a second function adjustment circuit, and a switch unit. The multi-functional pin is coupled to the external setting unit. The switch unit is coupled to the multi-functional pin, the first function adjustment circuit, and the second function adjustment circuit. The first function adjustment circuit senses a programmable reference voltage of the external setting unit according to one operation of the switch unit, and the second function adjustment circuit senses a programmable reference current of the external setting unit according to another operation of the switch unit.

According to an exemplary embodiment of the invention, the switch unit includes a first switch and a second switch. A first terminal of the first switch is coupled to the multi-functional pin, a second terminal of the first switch is coupled to the first function adjustment circuit, and a control terminal of the first switch is controlled by a first control signal. A first terminal of the second switch is coupled to the multi-functional pin, a second terminal of the second switch is coupled to the second function adjustment circuit, and a control terminal of the second switch is controlled by a second control signal. The first switch and the second switch are not turned on during the same period.

According to an exemplary embodiment of the invention, the external setting unit includes a resistor network, and the resistor network receives a reference voltage and provides the programmable reference voltage to the multi-functional pin.

According to an exemplary embodiment of the invention, the external setting unit further includes an external setting circuit that is connected to a control terminal of the switch unit.

According to an exemplary embodiment of the invention, the IC further includes a logic circuit that is configured to generate the first control signal and the second control signal.

According to an exemplary embodiment of the invention, the IC further includes an external setting pin that is coupled to the control terminal of the first switch and the control terminal of the second switch. The external setting pin receives an external control signal, and the external control signal includes the first control signal and the second control signal.

According to an exemplary embodiment of the invention, the first function adjustment circuit includes a current source, a voltage sensing circuit, and a first function setting circuit. The voltage sensing circuit is coupled between the current source and the switch unit and configured to sense the programmable reference voltage to generate a first parameter signal. The first function setting circuit is configured to receive the first parameter signal and respond to the first parameter signal to execute a first function setting.

According to an exemplary embodiment of the invention, the second function adjustment circuit includes a first resistor, a current sensing circuit, and a second function setting circuit. A first terminal of the first resistor is coupled to the switch unit. The current sensing circuit is coupled to a second terminal of the first resistor and configured to sense the programmable reference current on the first resistor to generate a second parameter signal. The second function setting circuit is configured to receive the second parameter signal and respond to the second parameter signal to execute a second function setting.

According to an exemplary embodiment of the invention, the second function adjustment circuit further includes a first current mirror, an n-type metal oxide semiconductor field effect transistor (MOSFET), a first comparator, a second current mirror, a p-type MOSFET, and a second comparator. A first terminal of the first current mirror is coupled to a first operational voltage. A drain of the n-type MOSFET is coupled to a second terminal of the first current mirror, and a source of the n-type MOSFET is coupled to the second terminal of the first resistor. A first input terminal of the first comparator receives a first threshold voltage, a second input terminal of the first comparator is coupled to the source of the n-type MOSFET and the second terminal of the first resistor, and an output terminal of the first comparator is coupled to a gate of the n-type MOSFET. A second terminal of the second current mirror is coupled to a second operational voltage. A drain of the p-type MOSFET is coupled to a first terminal of the second current mirror, and a source of the p-type MOSFET is coupled to the second terminal of the first resistor. A first input terminal of the second comparator receives a second threshold voltage, a second input terminal of the second comparator is coupled to the source of the p-type MOSFET and the second terminal of the first resistor, and an output terminal of the second comparator is coupled to a gate of the p-type MOSFET.

According to an exemplary embodiment of the invention, the second function adjustment circuit is coupled to the switch unit through a voltage buffer.

According to an exemplary embodiment of the invention, the second function adjustment circuit includes a first resistor, a current sensing circuit, and a second function setting circuit. A first terminal of the first resistor is coupled to an output terminal of the voltage buffer. The current sensing circuit is coupled to a second terminal of the first resistor and configured to sense the programmable reference current on the first resistor to generate a second parameter signal. The second function setting circuit is configured to receive the second parameter signal and respond to the second parameter signal to execute a second function setting.

In an exemplary embodiment of the invention, a multi-functional parameter setting method includes following steps: providing an integrated circuit (IC) which includes a switch unit and a multi-functional pin that is coupled to an external setting unit; sensing a programmable reference voltage of the external setting unit through one operation of the switch unit and executing a first function setting according to the programmable reference voltage; sensing a programmable reference current of the external setting unit through another operation of the switch unit and executing a second function setting according to the programmable reference current.

As discussed above, in the IC and the multi-functional parameter setting method described herein, function settings may be executed by means of one multi-functional pin, and thereby the area occupied by the IC does not increase. From another perspective, in comparison with the circuit area of the conventional IC, the circuit area of the IC described herein is relatively small, and thus the manufacturing costs of the IC described herein may be lowered down.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the exemplary embodiments of the invention, examples of which are illustrated in the accompanying drawings. In addition, whenever possible, identical or similar reference numbers stand for identical or similar elements in the figures and the embodiments.

Figure 1:
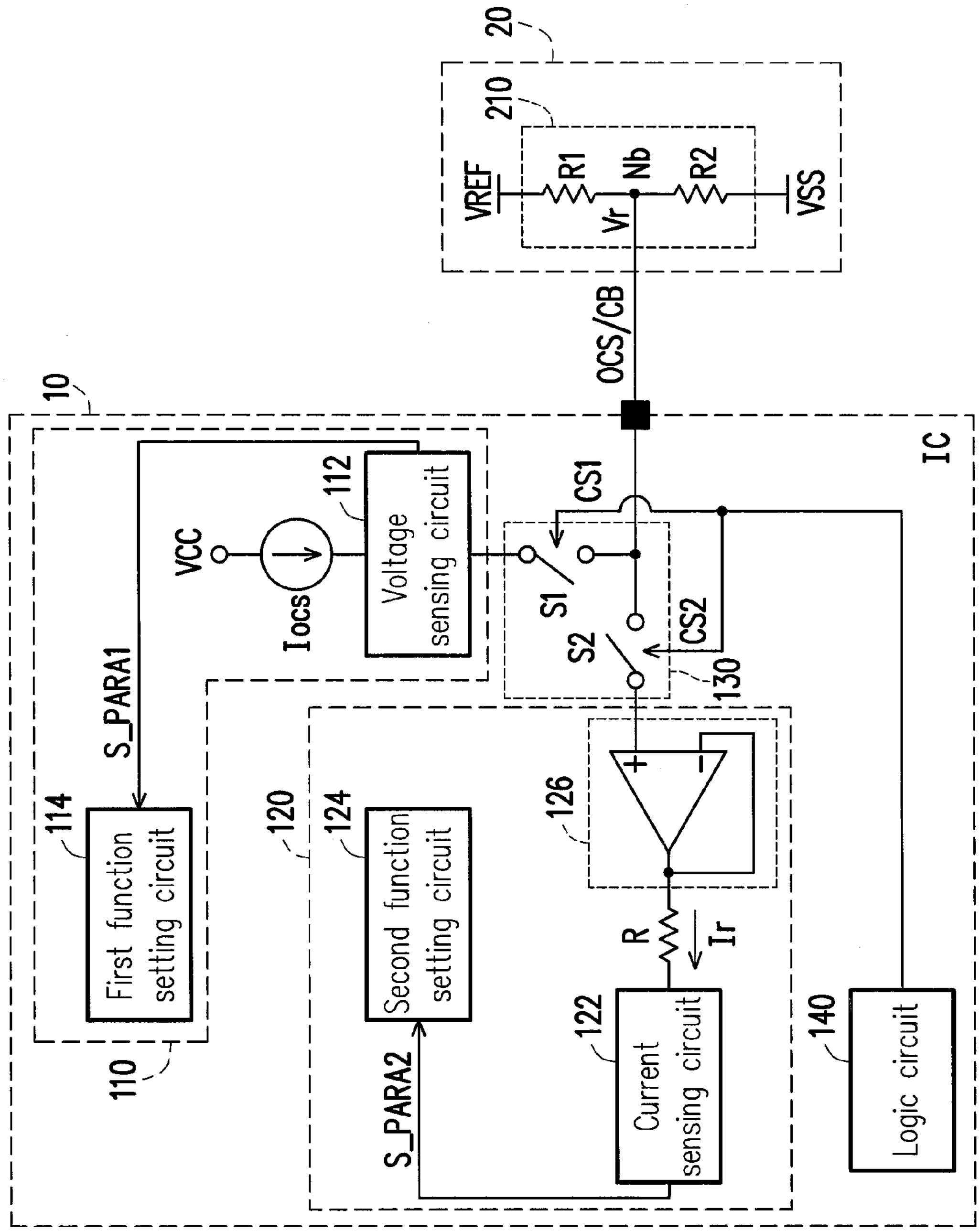
FIG. 1 is a schematic diagram illustrating an integrated circuit (IC) with multi-functional parameter setting according to an exemplary embodiment of the invention.

FIG. 1 is a schematic diagram illustrating an integrated circuit (IC) with multi-functional parameter setting according to an exemplary embodiment of the invention. Please refer to FIG. 1. The IC 10 includes a multi-functional pin OCS/CB, a first function adjustment circuit 110, a second function adjustment circuit 120, and a switch unit 130.

The multi-functional pin OCS/CB is coupled to the external setting unit 20. The switch unit 130 is coupled to the multi-functional pin OCS/CB, the first function adjustment circuit 110, and the second function adjustment circuit 120. The first function adjustment circuit 110 senses a programmable reference voltage Vr of the external setting unit 20 according to one operation of the switch unit 130, and the second function adjustment circuit 120 senses a programmable reference current Ir of the external setting unit 20 according to another operation of the switch unit 130.

According to the present exemplary embodiment, the switch unit 130 includes a first switch S1 and a second switch S2. A first terminal of the first switch S1 is coupled to the multi-functional pin OCS/CB. A second terminal of the first switch S1 is coupled to the first function adjustment circuit 110. A control terminal of the first switch S1 is controlled by a first control signal CS 1. A first terminal of the second switch S2 is coupled to the multi-functional pin OCS/CB. A second terminal of the second switch S2 is coupled to the second function adjustment circuit 120. A control terminal of the second switch S2 is controlled by a second control signal CS2. The first switch S1 and the second switch S2 are not turned on during the same period.

An external setting unit 20 is located outside the IC 10. The external setting unit 20 includes a resistor network 210 that is coupled to reference voltages VREF and VSS. The resistor network 210 has a node Nb that may provide the programmable reference voltage Vr to the multi-functional pin OCS/CB. In the present exemplary embodiment, the resistor network 210 is constituted by resistors R1 and R2 that are serially connected; however, the resistors may be connected to a capacitor or other components in series or in parallel in other exemplary embodiments, so as to generate an impedance value. The resistor network 210 is not limited herein and may be otherwise modified.

Figure 2:
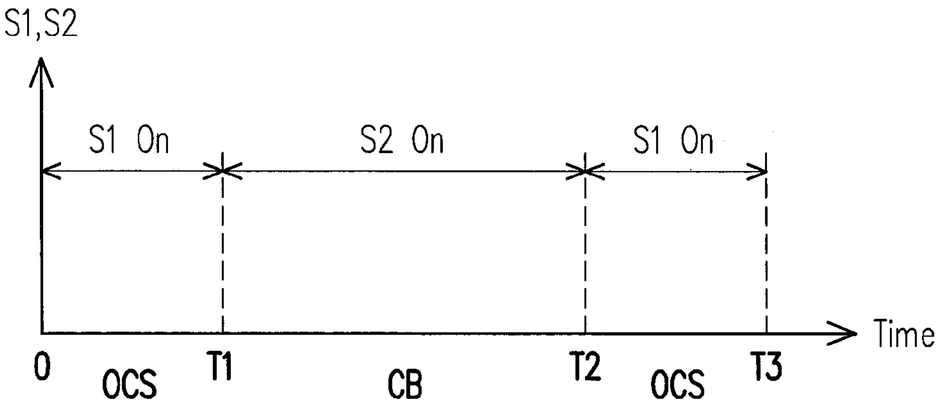
FIG. 2 and FIG. 3 are operational timing diagrams illustrating the first and second switches depicted in FIG. 1.
Figure 3:
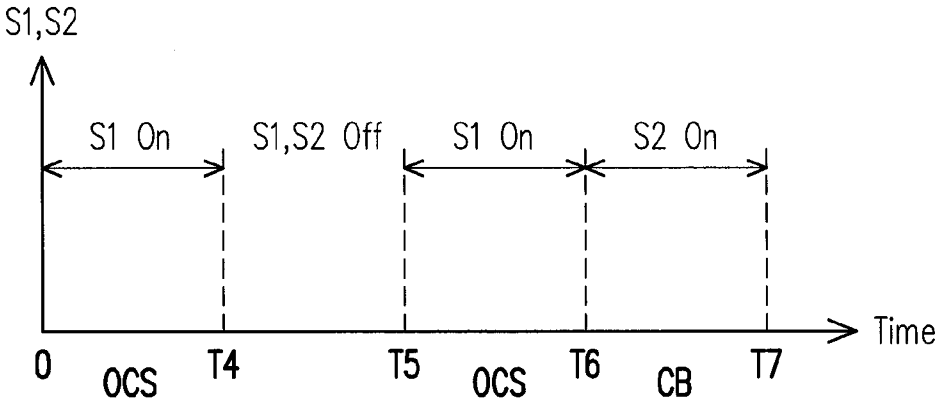

FIG. 2 and FIG. 3 are operational timing diagrams illustrating the first and second switches S1 and S2 depicted in FIG. 1. Here, T1 to T7 respectively represent different points. During the same period, the first switch S1 and the second switch S2 are not turned on simultaneously; therefore, the function setting may be executed by one of the first function adjustment circuit 110 and the second function adjustment circuit 120. In addition, according to an exemplary embodiment, neither the first switch S1 nor the second switch S2 is turned on during the same period. That is, only one of the first function adjustment circuit 110 and the second function adjustment circuit 120 is allowed to operate at different time frames.

For instance, in a time period from T1 to T2, the second switch S2 is turned on, and the IC 10 executes a current balance (CB) function setting; in a time period from T4 to T5, neither the first switch S1 nor the second switch S2 is turned on, and the IC 10 does not execute any function setting; in a time period from T5 to T6, the first switch S1 is turned on, and the IC 10 executes an over current setting (OCS). According to the description presented above, people skilled in the art may be aware of other function settings through the drawings, and thus no further description is provided hereinafter.

Detailed circuitry of the first and second function adjustment circuits 110 and 120 shown in FIG. 1 will be elaborated hereinafter. Please refer to FIG. 1. The IC 10 may have two adjustment mechanisms.

The first function adjustment circuit 110 (e.g., a voltage adjustment mechanism) includes a current source Iocs, a voltage sensing circuit 112, and a first function setting circuit 114. The voltage sensing circuit 112 is coupled between the current source Iocs and the first switch S1. Here, the voltage sensing circuit 112 is configured to sense the programmable reference voltage Vr to generate a first parameter signal S_PARA1. The first function setting circuit 114 receives the first parameter signal S_PARA1 and responds to the first parameter signal S_PARA1 to execute a first function setting.

The second function adjustment circuit 120 (e.g., a current adjustment mechanism) includes a resistor R, a current sensing circuit 122, and a second function setting circuit 124. A first terminal of the resistor R is coupled to the second switch S2. The current sensing circuit 122 is coupled to a second terminal of the resistor R and configured to sense the programmable reference current Ir on the resistor R to generate a second parameter signal S_PARA2. The second function setting circuit 124 receives the second parameter signal S_PARA2 and responds to the second parameter signal S_PARA2 to execute a second function setting.

It should be mentioned that the first parameter signal S_PARA1 and the second parameter signal S_PARA2 may be respectively transmitted to the first function setting circuit 114 and the second function setting circuit 124 at different time frames. Here, the first function setting circuit 114 and the second function setting circuit 124 may act as analog/digital converters or may serve to provide the CB function, an output voltage shift function, or a droop function. That is, the IC 10 may execute multiple function settings by means of one multi-functional pin OCS/CB.

The IC 10 may further include a logic circuit 140. The logic circuit 140 is configured to generate the first control signal CS 1 and the second control signal CS2, so as to respectively control the on/off states of the first switch S1 and the second switch S2. The invention does not pose limitations on the detailed scheme of the logic circuit 140. The second function adjustment circuit 120 may further include a voltage buffer 126, and thus the resistor R is able to be coupled to the second switch S2 through the voltage buffer 126. The configuration of the voltage buffer 126 may prevent the load effects (generated by the programmable reference current Ir) on the programmable reference voltage Vr. Moreover, the design of the IC is rather simple according to an exemplary embodiment of the invention.

Figure 4:
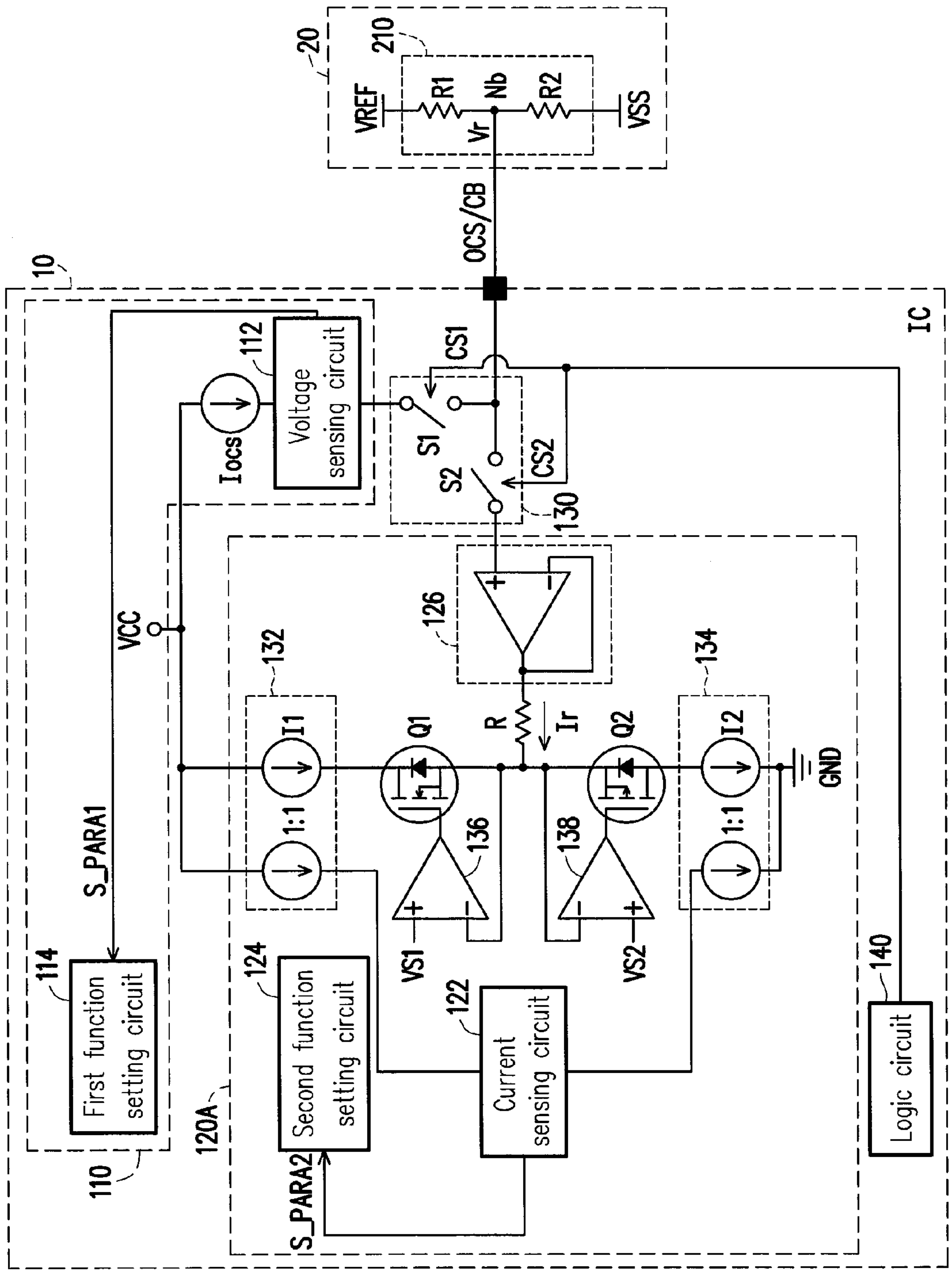
FIG. 4 is a schematic diagram illustrating an IC with multi-functional parameter setting according to another exemplary embodiment of the invention.

FIG. 4 is a schematic diagram illustrating an IC with multi-functional parameter setting according to another exemplary embodiment of the invention. Here, FIG. 4 depicts another exemplary embodiment that is derived from the structure shown in FIG. 1. One of the differences between FIG. 4 and FIG. 1 lies in the second function adjustment circuit 120A. In FIG. 4, the second function adjustment circuit 120A further includes a first current mirror 132, an n-type metal oxide semiconductor field effect transistor (MOSFET) Q1, a first comparator 136, a second current mirror 134, a p-type MOSFET Q2, and a second comparator 138.

A first terminal of the first current mirror 132 is coupled to a first operational voltage VCC. A drain of the n-type MOSFET Q1 is coupled to a second terminal of the first current mirror 132, and a source of the n-type MOSFET Q1 is coupled to the second terminal of the resistor R. A non-inverted input terminal (i.e., a first input terminal) of the first comparator 136 receives a first threshold voltage VS1, an inverted input terminal (i.e., a second input terminal) of the first comparator 136 is coupled to the source of the n-type MOSFET Q1 and the second terminal of the resistor R, and an output terminal of the first comparator 136 is coupled to a gate of the n-type MOSFET Q1.

A second terminal of the second current mirror 134 is coupled to a second operational voltage GND. A drain of the p-type MOSFET Q2 is coupled to a first terminal of the second current mirror 134, and a source of the p-type MOSFET Q2 is coupled to the second terminal of the resistor R. A non-inverted input terminal (i.e., a first input terminal) of the second comparator 138 receives a second threshold voltage VS2, an inverted input terminal (i.e., a second input terminal) of the second comparator 138 is coupled to the source of the p-type MOSFET Q2 and the second terminal of the resistor R, and an output terminal of the second comparator 138 is coupled to a gate of the p-type MOSFET Q2.

A second reference voltage VSS and the second operational voltage GND are assumed to be ground voltages. When the first switch S1 is turned on, and the second switch S2 is not turned on, the programmable reference voltage Vr on the multi-functional pin OCS/CB may be represented by the following equation 1 according to a principle of superposition.

$$V_{OCS/CB(S1\_ON)} = I_{OCS} \times (R1 \| R2) + VREF \times \frac{R2}{R1 + R2} \quad \text{(Equation 1)}$$

It can be learned from the equation 1 that the function setting of the first function setting circuit 114 may be determined by adjusting the value of the resistor R1 or the value of the resistor R2 in the resistor network 210.

The voltage buffer 126 may block the programmable reference current Ir, such that the programmable reference current Ir is not drawn from the multi-functional pin OCS/CB. By contrast, when the first switch S1 is not turned on, and the second switch S2 is turned on, the programmable reference voltage Vr on the multi-functional pin OCS/CB may be represented by the following equation 2.

$$Vr = V_{OCS/CB(S2\_ON)} = VREF \times \frac{R2}{R1 + R2}; \quad \text{(Equation 2)}$$

$$\text{If } V_{OCS/CB(S2\_ON)} < VS1, \text{ then S\_PARA2} = I1;$$

$$\text{If } V_{OCS/CB(S2\_ON)} > VS2, \text{ then S\_PARA2} = I2;$$

$$\text{If } VS1 < V_{OCS/CB(S2\_ON)} < VS2, \text{ then S\_PARA2} = 0$$

It may be assumed that the voltage buffer 126 does not exist; in this case, when the first switch S1 is not turned on, and the second switch S2 is turned on, the programmable reference voltage Vr on the multi-functional pin OCS/CB may be modified and represented by the following equation 3.

$$Vr = V_{OCS/CB(S2\_ON)}; \quad \text{(Equation 3)}$$

$$= VREF \times \frac{R2}{R1+R2} + I1(\text{or } I2) \times [(R1 \| R2) + R];$$

$$\text{If } V_{OCS/CB(S2\_ON)} < VS1, \text{ then S\_PARA2} = I1;$$

$$\text{If } V_{OCS/CB(S2\_ON)} > VS2, \text{ then S\_PARA2} = I2;$$

$$\text{If } VS1 < V_{OCS/CB(S2\_ON)} < VS2, \text{ then S\_PARA2} = 0$$

It can be learned from FIG. 4 and the equations 2 and 3 that the programmable reference voltage Vr may be determined by adjusting the value of the resistor R1 or the value of the resistor R2 in the resistor network 210. The function setting of the second function setting circuit 124 is relevant to the programmable reference current Ir, the programmable reference voltage Vr, the first threshold voltage VS1, and the second threshold voltage VS2.

Figure 5:
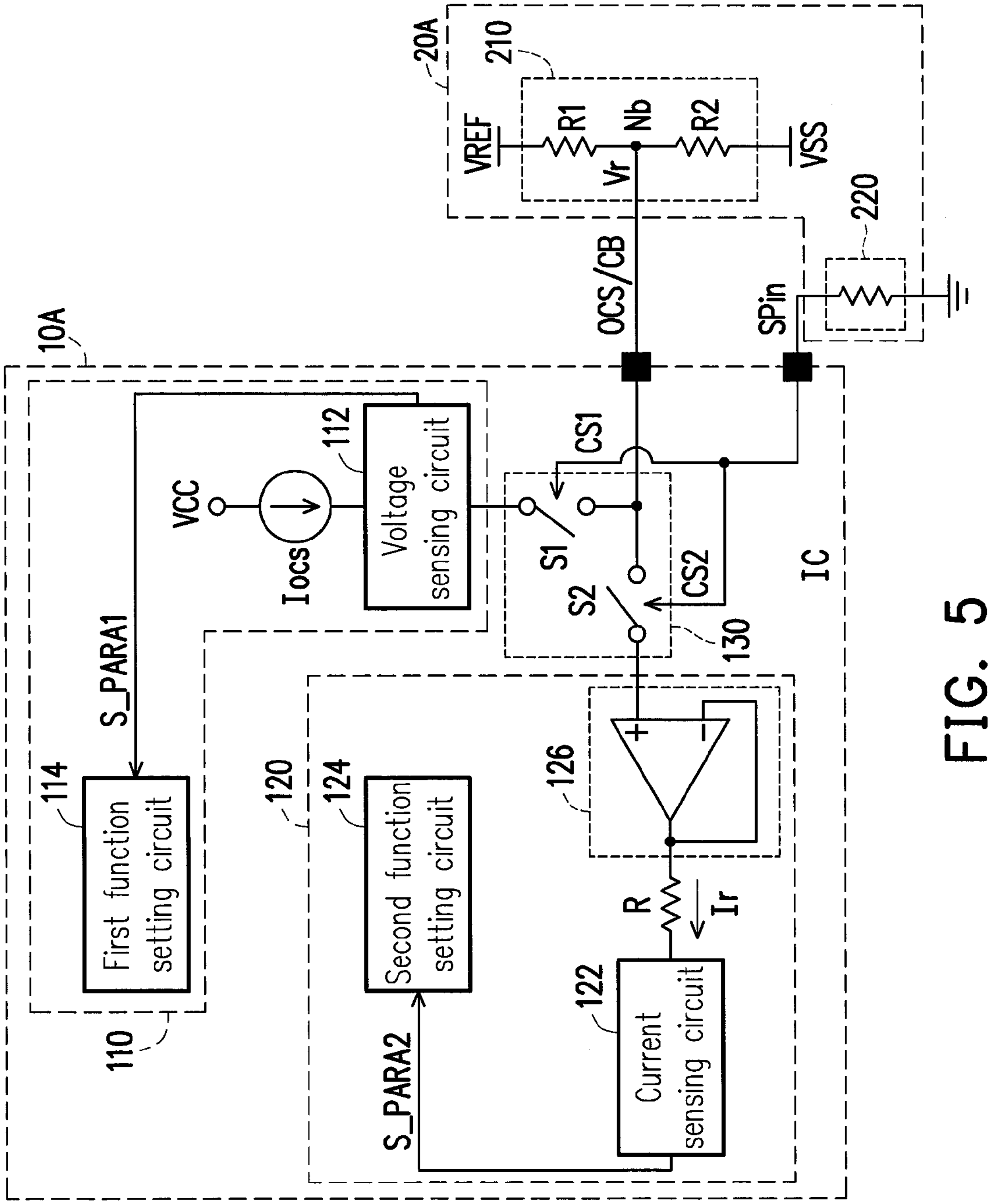
FIG. 5 is a schematic diagram illustrating an IC with multi-functional parameter setting according to another exemplary embodiment of the invention.

FIG. 5 is a schematic diagram illustrating an IC with multi-functional parameter setting according to another exemplary embodiment of the invention. Here, FIG. 5 depicts another exemplary embodiment that is derived from the structure shown in FIG. 1. One of the differences between FIG. 5 and FIG. 1 lies in that the IC 10A depicted in FIG. 4 further includes an external setting pin Spin but does not include the logic circuit 140 shown in FIG. 1. The external setting pin SPin is coupled to the control terminal of the first switch S1 and the control terminal of the second switch S2. Here, the external setting pin SPin receives an external control signal, and the external control signal includes the first control signal CS1 and the second control signal CS2.

The external setting unit 20A includes a resistor network 210 and an external setting circuit 220. The external setting circuit 220 is connected to the control terminal of the switch unit 130. A user may determine the on/off states of the first switch S1 and the second switch S2 through the external setting circuit 220. During the same period, the first switch S1 and the second switch S2 are not turned on simultaneously, but it is possible that neither the first switch S1 nor the second switch S2 is turned on. Hence, at different time frames, a user is able to enable one of the first function adjustment circuit 110 and the second function adjustment circuit 120 to execute the function setting.

Figure 6:
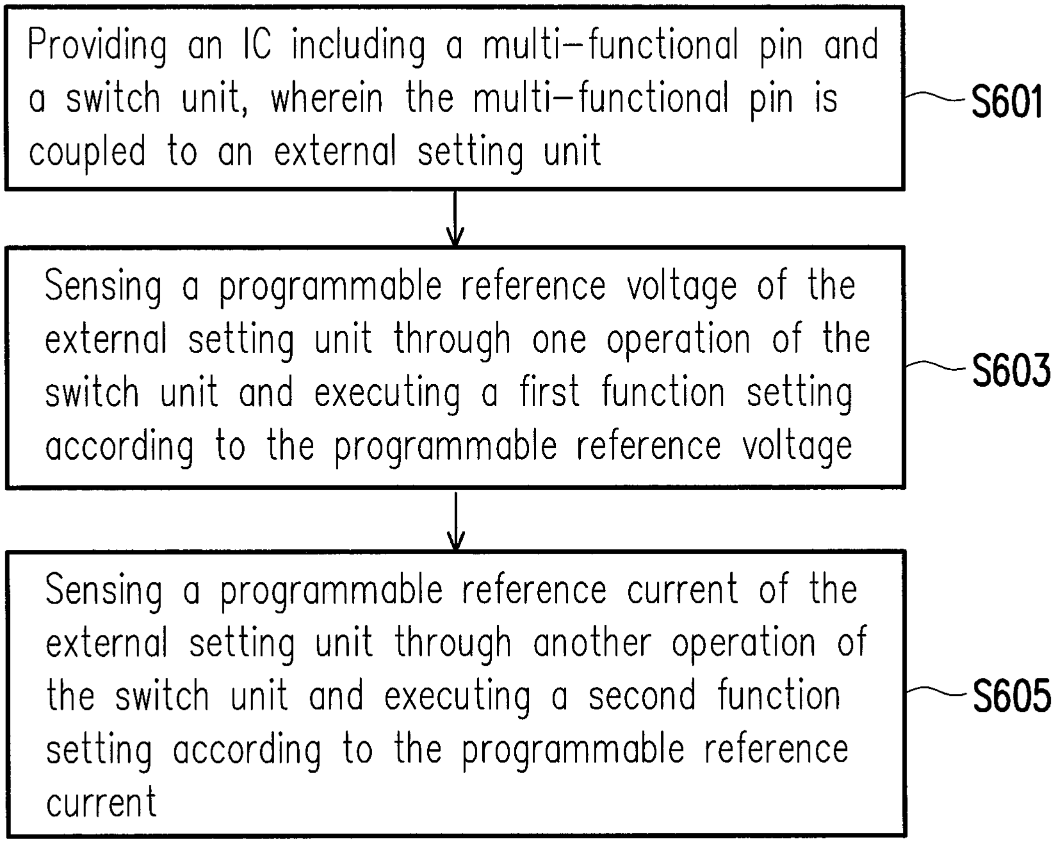
FIG. 6 is a flow chart illustrating a parameter setting method according to an exemplary embodiment of the invention.

Based on the descriptions disclosed in the aforementioned exemplary embodiments, a common multi-functional parameter setting method may be briefed below. FIG. 6 is a flow chart illustrating a multi-functional parameter setting method according to an exemplary embodiment of the invention. With reference to FIG. 1 and FIG. 6, the multi-functional parameter setting method described in the present exemplary embodiment may include following steps.

In step S601, an IC 10 is provided, and the IC 10 includes a multi-functional pin OCS/CB and a switch unit 130. Here, the multi-functional pin OCS/CB is coupled to an external setting unit 20.

In step S603, a programmable reference voltage Vr of the external setting unit 20 is sensed through one operation of the switch unit 130, and a first function setting is executed according to the programmable reference voltage Vr.

In step S605, a programmable reference current Ir of the external setting unit 20 is sensed through another operation of the switch unit 130, and a second function setting is executed according to the programmable reference current Ir.

To sum up, in the IC 10 and the multi-functional parameter setting method described herein, function settings may be executed by means of one multi-functional pin OCS/CB, and thereby the area occupied by the IC does not increase. From another perspective, in comparison with the circuit area of the conventional IC, the circuit area of the IC 10 described herein is relatively small, and thus the manufacturing costs of the IC described herein may be lowered down.

Although the invention has been described with reference to the above exemplary embodiments, it will be apparent to one of ordinary skill in the art that modifications to the described exemplary embodiments may be made without departing from the spirit of the invention. Accordingly, the scope of the invention will be defined by the attached claims and not by the above detailed descriptions.

What is claimed is:

1. An integrated circuit with multi-functional parameter setting, the integrated circuit being coupled to an external setting unit and comprising:

a multi-functional pin coupled to the external setting unit;

a first function adjustment circuit;

a second function adjustment circuit; and a switch unit coupled to the multi-functional pin, the first function adjustment circuit, and the second function adjustment circuit, wherein the first function adjustment circuit senses a programmable reference voltage of the external setting unit according to one operation of the switch unit, and the second function adjustment circuit senses a programmable reference current of the external setting unit according to another operation of the switch unit.

2. The integrated circuit according to claim 1, wherein the switch unit comprises:

a first switch, having a first terminal coupled to the multi-functional pin, a second terminal coupled to the first function adjustment circuit, and a control terminal controlled by a first control signal; and a second switch, having a first terminal coupled to the multi-functional pin, a second terminal coupled to the second function adjustment circuit, and a control terminal controlled by a second control signal, wherein the first switch and the second switch are not turned on during a same period.

3. The integrated circuit according to claim 1, wherein the external setting unit comprises a resistor network, and the resistor network receives a reference voltage and provides the programmable reference voltage to the multi-functional pin.

4. The integrated circuit according to claim 1, wherein the external setting unit further comprises an external setting circuit connected to a control terminal of the switch unit.

5. The integrated circuit according to claim 2, further comprising:

a logic circuit configured to generate the first control signal and the second control signal.

6. The integrated circuit according to claim 2, further comprising:

an external setting pin coupled to the control terminal of the first switch and the control terminal of the second switch and receives an external control signal, and the external control signal comprises the first control signal and the second control signal.

7. The integrated circuit according to claim 1, wherein the first function adjustment circuit comprises:

a current source;

a voltage sensing circuit coupled between the current source and the switch unit and configured to sense the programmable reference voltage to generate a first parameter signal; and a first function setting circuit configured to receive the first parameter signal and respond to the first parameter signal to execute a first function setting.

8. The integrated circuit according to claim 1, wherein the second function adjustment circuit comprises:

a first resistor, having a first terminal coupled to the switch unit;

a current sensing circuit coupled to a second terminal of the first resistor and configured to sense the programmable reference current on the first resistor to generate a second parameter signal; and a second function setting circuit configured to receive the second parameter signal and respond to the second parameter signal to execute a second functional setting.

9. The integrated circuit according to claim 8, wherein the second function adjustment circuit further comprises:

a first current mirror, having a first terminal coupled to a first operational voltage;

an n-type metal oxide semiconductor field effect transistor, having a drain coupled to a second terminal of the first current mirror, and a source coupled to the second terminal of the first resistor;

a first comparator, having a first input terminal receiving a first threshold voltage, a second input terminal coupled to the source of the n-type metal oxide semiconductor field effect transistor and the second terminal of the first resistor, and an output terminal coupled to a gate of the n-type metal oxide semiconductor field effect transistor;

a second current mirror, having a second terminal coupled to a second operational voltage;

a p-type metal oxide semiconductor field effect transistor, having a drain coupled to a first terminal of the second current mirror, and a source coupled to the second terminal of the first resistor; and a second comparator, having a first input terminal receiving a second threshold voltage, a second input terminal coupled to the source of the p-type metal oxide semiconductor field effect transistor and the second terminal of the first resistor, and an output terminal coupled to a gate of the p-type metal oxide semiconductor field effect transistor.

10. The integrated circuit according to claim 1, wherein the second function adjustment circuit is coupled to the switch unit through a voltage buffer.

11. The integrated circuit according to claim 10, wherein the second function adjustment circuit comprises:

a first resistor, having a first terminal coupled to an output terminal of the voltage buffer;

a current sensing circuit coupled to a second terminal of the first resistor and configured to sense the programmable reference current on the first resistor to generate a second parameter signal; and a second function setting circuit configured to receive the second parameter signal and respond to the second parameter signal to execute a second functional setting.

12. A multi-functional parameter setting method comprising:

providing an integrated circuit which comprises a multi-functional pin and a switch unit, wherein the multi-functional pin is coupled to an external setting unit;

sensing a programmable reference voltage of the external setting unit through one operation of the switch unit and executing a first function setting according to the programmable reference voltage; and sensing a programmable reference current of the external setting unit through another operation of the switch unit and executing a second function setting according to the programmable reference current.

* * * * *